US009911471B1

(12) United States Patent
Tsukada

(10) Patent No.: US 9,911,471 B1
(45) Date of Patent: Mar. 6, 2018

(54) INPUT BUFFER CIRCUIT

(71) Applicant: Micron Technology, Inc., Boise, ID (US)

(72) Inventor: Shuichi Tsukada, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/432,864

(22) Filed: Feb. 14, 2017

(51) Int. Cl.
*G11C 7/10* (2006.01)
*G11C 7/06* (2006.01)
*G11C 5/14* (2006.01)

(52) U.S. Cl.
CPC .............. *G11C 7/1084* (2013.01); *G11C 5/14* (2013.01); *G11C 7/065* (2013.01)

(58) Field of Classification Search
CPC .......... G11C 7/1084; G11C 7/065; G11C 5/14
USPC .......................... 365/189.05, 189.08, 189.09
See application file for complete search history.

(56) References Cited

U.S. PATENT DOCUMENTS

| | | | | | |
|---|---|---|---|---|---|
| 4,780,689 | A | * | 10/1988 | Saller ..................... | H03F 3/3076 330/255 |
| 5,247,479 | A | * | 9/1993 | Young ..................... | G11C 7/062 327/52 |
| 5,426,381 | A | * | 6/1995 | Flannagan ....... | H03K 3/356034 326/66 |
| 5,854,562 | A | * | 12/1998 | Toyoshima ............ | G11C 7/065 327/55 |
| 5,872,736 | A | * | 2/1999 | Keeth ................... | G11C 7/1042 326/83 |
| 5,917,758 | A | * | 6/1999 | Keeth .................. | H03K 17/164 326/27 |
| 5,977,798 | A | * | 11/1999 | Zerbe ............... | H03K 3/356121 326/115 |
| 6,127,849 | A | * | 10/2000 | Walker ............. | H03K 19/00361 326/86 |
| 6,191,989 | B1 | * | 2/2001 | Luk ........................ | G11C 7/062 365/207 |
| 6,462,584 | B1 | * | 10/2002 | Proebsting ............. | G11C 7/065 257/E21.659 |

(Continued)

OTHER PUBLICATIONS

JEDEC Standard: Low Power Double Data Rate 4 (LPDDR4), JESD209-4A, Nov. 2015.

(Continued)

*Primary Examiner* — Viet Q Nguyen
(74) *Attorney, Agent, or Firm* — Dorsey & Whitney LLP

(57) ABSTRACT

Apparatuses for receiving an input signal in a semiconductor device are described. An example apparatus includes: a first amplifier that provides first and second intermediate voltages responsive to first and second input voltages; first and second voltage terminals; a circuit node; a first transistor coupled between the first voltage terminal and the circuit node and is turned on responsive to at least one of the first and second intermediate voltages; a second amplifier including first and second inverters, at least one of the first and second inverters being coupled between the circuit node and the second voltage terminal; and first and second output nodes, the first output node being coupled to an input node of the first inverter and an output node of the second inverter, and the second output node being coupled to an output node of the first inverter and an input node of the second inverter.

14 Claims, 7 Drawing Sheets

(56) References Cited

U.S. PATENT DOCUMENTS

| | | | | |
|---|---|---|---|---|
| 6,833,739 | B2* | 12/2004 | Isoda | H03K 17/693 |
| | | | | 326/83 |
| 6,965,262 | B2* | 11/2005 | Zerbe | G11C 7/02 |
| | | | | 327/336 |
| 7,049,853 | B2* | 5/2006 | Wang | G11C 7/06 |
| | | | | 327/51 |
| 7,463,519 | B1* | 12/2008 | Kikuchi | G11C 16/0466 |
| | | | | 365/185.05 |
| 7,511,538 | B2* | 3/2009 | Kang | H03K 5/2481 |
| | | | | 327/51 |
| 8,693,264 | B2* | 4/2014 | Chand Sk | G11C 7/065 |
| | | | | 365/189.05 |
| 9,438,211 | B1* | 9/2016 | Chong | H03K 3/356121 |
| 9,673,758 | B2* | 6/2017 | Kwon | H03F 1/0205 |
| 2007/0064504 | A1* | 3/2007 | Jeon | H04L 25/0292 |
| | | | | 365/189.05 |
| 2007/0127296 | A1* | 6/2007 | Cha | G11C 7/1078 |
| | | | | 365/189.05 |
| 2014/0118025 | A1* | 5/2014 | Kim | H03K 19/0948 |
| | | | | 326/24 |

OTHER PUBLICATIONS

Schinkel, et al., "A Double-Tail Latch-Type Voltage Sense Amplifier with 18ps Setup+Hold Time", IEEE, ISSCC 2007, Session 17, Analog Techniques and PLLs, 17.7 (Retrieved Feb. 13, 2007).

* cited by examiner

INPUT BUFFER CIRCUIT

BACKGROUND

High data reliability, high speed of memory access, and reduced chip size are features that are demanded from semiconductor memory.

In recent years, there has been an effort to increase access speed while reducing power consumption for semiconductor devices. As part of that effort to increase access speed, it may be desirable to include input receiver circuits having faster operation in input buffers for receiving address signals, command signals and dock signals. Simultaneously, it may be desirable to accommodate a wide range of input signals at the input receiver circuits to meet recent semiconductor devices (e.g., low-power double data rate synchronous DRAM). For example, Low Power Double Data Rate 4 (LPDDR4) specification (JESD209-4) specifies that an data input reference voltage ($V_{REF}$) operating point range from 10% to 42% of a power supply voltage for data input ($V_{DD}$). Along these lines, an input receiver circuit including differential amplifiers have been developed. For example, a data latch type input buffer has been used as an input buffer for memory devices (e.g., LPDDR4). A data latch type input (DQ) buffer in a memory device amplifies a data signal and latches the data signal by amplifying a voltage difference between the data input signal and the $V_{REF}$ when a clock signal CLK is at a logic high level, and initializes each node in the DQ buffer by precharging each node when the clock signal CLK is at a logic low level. The DQ input buffer performs a sequence of amplification and latch operation responsive to a signal input and a precharge operation in turn during each clock cycle. Source nodes of input transistors may receive a power supply voltage $V_{DD}$ and gate nodes of the input transistors coupled to input nodes (IN+ node and IN− node) may receive a data input signal DQ and the reference voltage $V_{REF}$, respectively while performing the sequence of amplification and latch operation. However, the input transistors may not be driven fast enough due to a smaller $V_{GS}$ of the input transistors M1 and M2, if a voltage of the data input signal DQ and the reference voltage $V_{REF}$ become higher (e.g., $V_{REF}$=42%*$V_{DD}$).

FIG. 1 is a circuit diagram of a conventional data input buffer circuit. The conventional data input buffer circuit includes a first amplifier including transistors M1, M2, M3, M4, MS and M6. A transistor M0 is a switch of the first amplifier. A data input signal DQ is provided to an IN+ node coupled to a gate of the transistor M1. The reference voltage $V_{REF}$ is provided to an IN− node coupled to a gate of the transistor M2. A sequence of amplification and latch operation are executed, when an inverted clock signal CLKB is at a logic low level that activates the transistor M0 and deactivates transistors M7-M10. The power supply voltage $V_{DD}$ is provided to nodes, (node1 and node2) through transistors M1 and M2, and voltages of the nodes (node1 and node2) are increased from a precharge level $V_{SS}$ responsive to the inverted clock signal CLKB is at the logic low level, depending on the data input signal DQ. Thus, a voltage difference Vdiff between the nodes (node1 and node2) may be caused based on a difference between a voltage of the input data input signal DQ and the reference voltage $V_{REF}$. Because the power supply voltage $V_{DD}$ is provided to nodes, (node1 and node2 ), voltages at an OUT− node and an OUT+ node may be increased from the precharge level $V_{SS}$ through transistors M3 and M4 respectively, when the voltage difference Vdiff exceeds a threshold voltage VTh of the transistor M3 or a threshold voltage VTh of the transistor M4. Due to voltages of the node1 and the node2 that are increased up to approximately the power supply voltage $V_{DD}$, the first amplifier latches a voltage difference between the OUT− node and the OUT+ node of the first amplifier, and a logic high level signal ($V_{DD}$) is provided to one of the OUT− node and the OUT+ node and a logic low level signal ($V_{SS}$) is provided to the other of the OUT− node and the OUT+ node. In a precharge operation, when the inverted clock signal CLKB is at a logic high level, the nodes node1, node2 OUT− and OUT+ are precharged by precharge transistors M7, M8, M9 and M10 to the a logic low level signal ($V_{SS}$). An increase of the voltage of the node1 above the threshold VTh of the transistor M3 drives capacitors (not shown) related to the transistor M1 and capacitors coupled to the OUT− node, (e.g., capacitors at gates of the transistors M4 and M6, a channel capacitor of the transistor M3 and a drain capacitor of the transistor M5), and a total capacitance of these capacitors is remarkably large. Similarly, a total capacitance of capacitors related to the transistor M2 is large. Accordingly, a time to increase voltages of the nodes (node1 and node2) around the power supply voltage VDD and to complete the sequence of amplification and latch operation to increase voltages at an OUT− node and an OUT+ node is longer when the data input signal DQ and the reference voltage $V_{REF}$ are higher, and the sequence of amplification and latch operation may not be completed by a precharge operation in the data input buffer circuit.

FIG. 2 is a circuit diagram of a conventional data input buffer circuit. The conventional data input buffer circuit includes a first amplifier and a second amplifier. The first amplifier includes transistors M1 and M2. The second amplifier includes transistors M12, M13, M14, M15, M16 and M17. A transistor M0 is a switch of the first amplifier and a transistor M11 is a switch of the second amplifier. A sequence of amplification and latch operation are executed, when a clock signal CLK is at a logic high level and an inverted clock signal CLKB is at a logic low level. Responsive to a difference in voltage increase speeds between nodes (node1 and node2) at gates of transistors M12 and M13, the second amplifier latches a data signal and a signal at a logic low level ($V_{SS}$) is provided to one of an OUT− node and an OUT+ node, and a precharge level ($V_{DD}$) is provided to the other outputted at the other of OUT− and OUT+. In the precharge operation, node1 and node2 are set to a logic low level ($V_{SS}$), and the OUT− node and the OUT+ node are precharged to the power supply voltage $V_{DD}$ responsive to the transistors M12 and M13 receiving the logic low level signal of the node1 and node2 at gates and coupling the power supply voltage $V_{DD}$ to the OUT− node and the OUT+ node. Since each of the transistors M1 and M2 includes a MOS capacitor having a capacitance smaller than a MOS capacitor in each of the transistors M1 and M2 of FIG. 1, voltages of node1 and node2 are increased faster than the voltages of node1 and node2 of FIG. 1. However, the second amplifier may complete a latch operation before a voltage difference between node1 and node2 is to be generated, if a voltage of the data input signal DQ and the reference voltage $V_{REF}$ become higher (e.g., $V_{REF}$=42%*$V_{DD}$). Thus, an activation of the second amplifier needs to be delayed. On the other hand, if the voltage of the data input signal DQ and the reference voltage $V_{REF}$ become lower, the voltages of node1 and node2 are increased too fast due to larger $V_{GS}$ of the transistors M1 and M2, and the voltages of nodel and node2 reach to approximately the power supply voltage $V_{DD}$ and the voltage difference disappears before the second amplifier completes the amplification, which causes a data latching failure.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as sonic disclosed embodiments can be combined with one or more other disclosed embodiments to form new embodiments.

Figure 1:
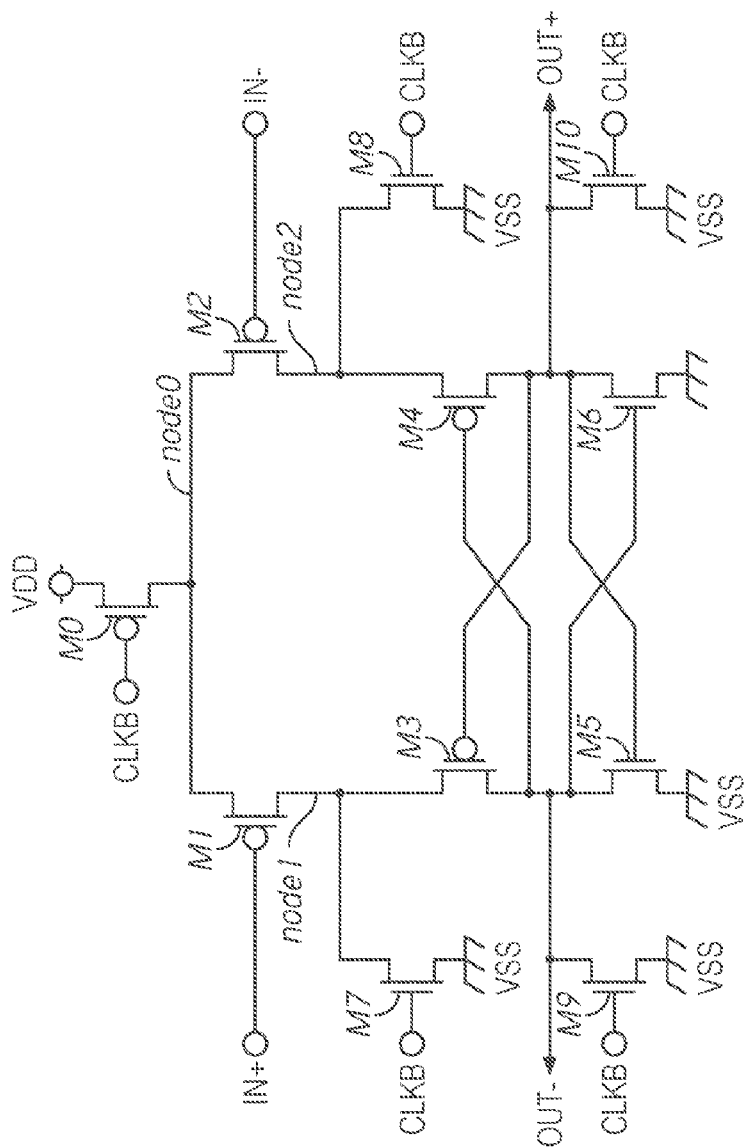
FIG. 1 is a circuit diagram of a conventional data input buffer circuit.
Figure 2:
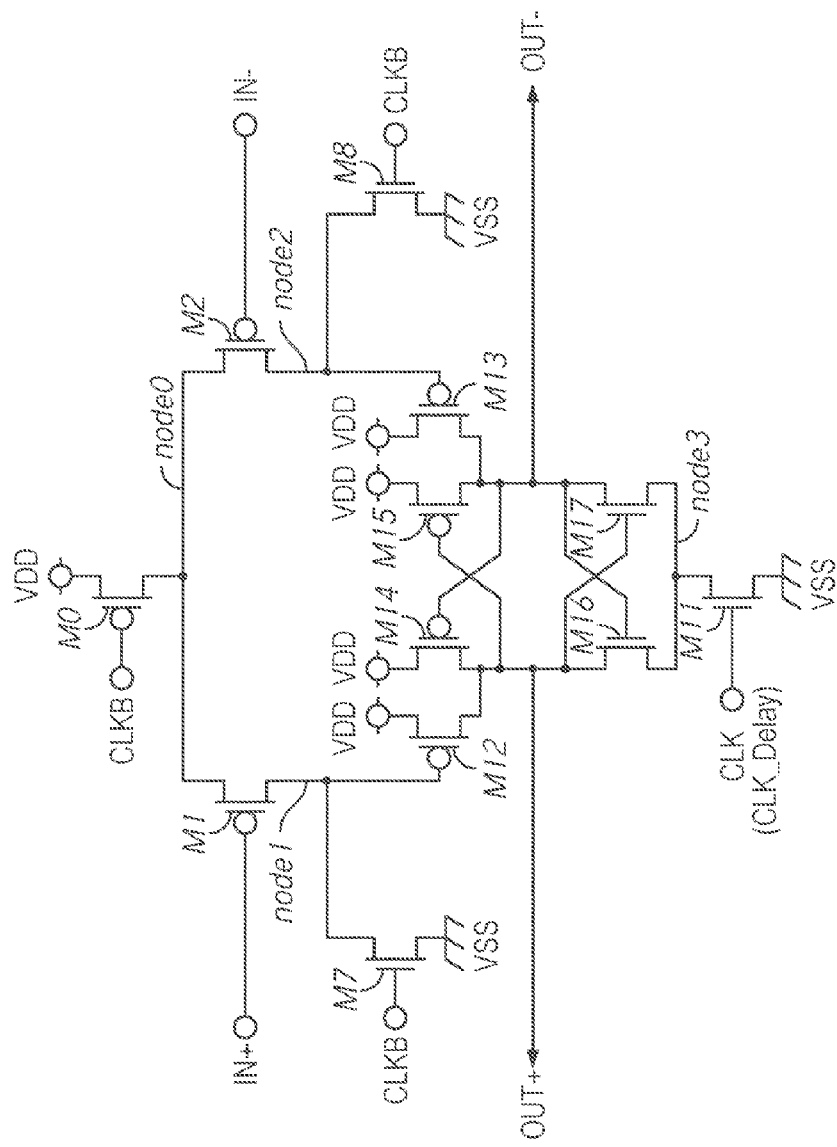
FIG. 2 is a circuit diagram of a conventional data input buffer circuit.
Figure 3:
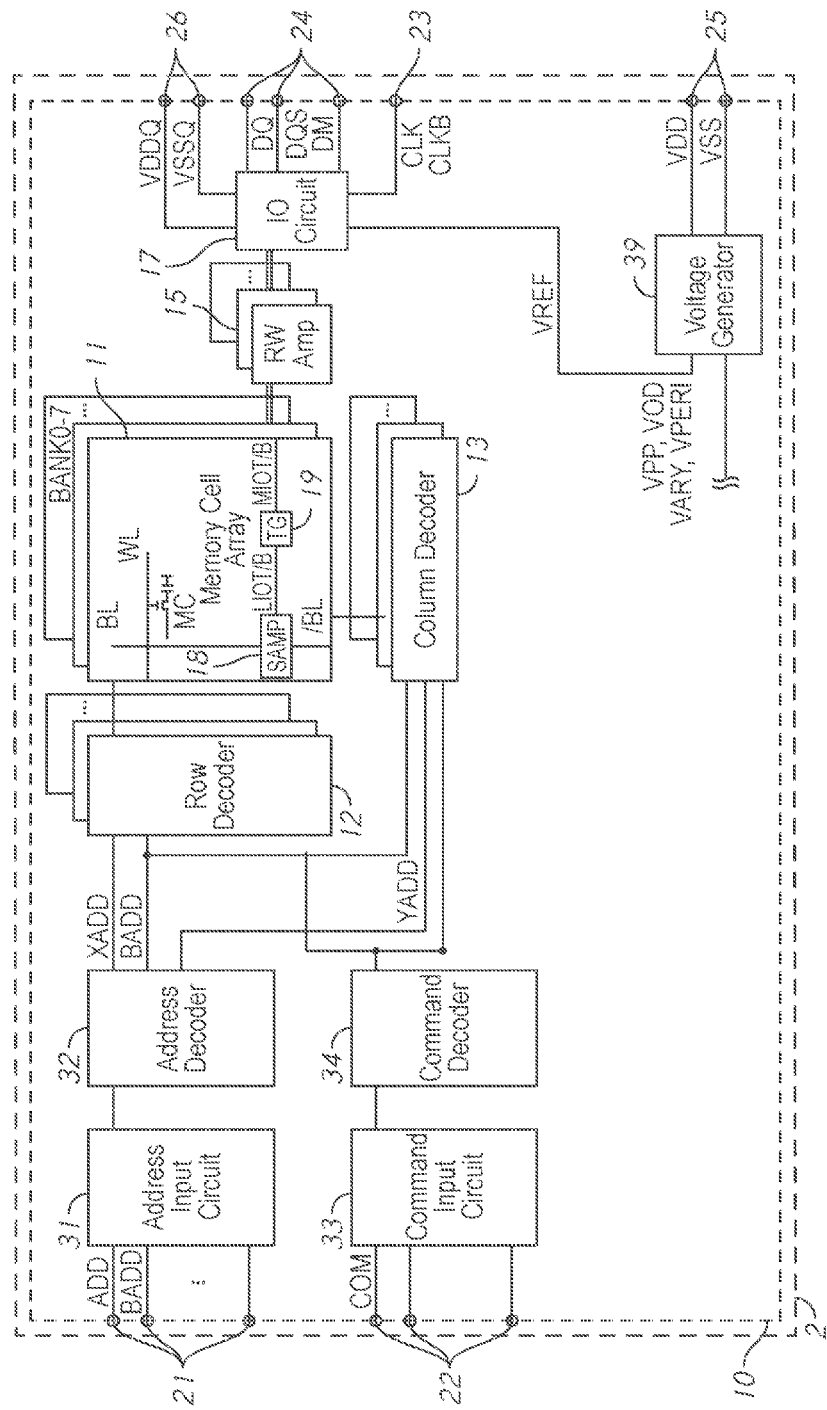
FIG. 3 is a block diagram of a semiconductor device in accordance with the present disclosure.

FIG. 3 is a block diagram of a semiconductor device in accordance with an embodiment of the present disclosure. The semiconductor device 10 may be an LPDDR4 SDRAM integrated into a single semiconductor chip, for example. The semiconductor device 10 may be mounted on an external substrate 2 that is a memory module substrate, a mother board or the like. As shown in FIG. 3, the semiconductor device 10 includes a memory cell array 11. The memory cell array 11 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. Sense amplifiers 18 are coupled to corresponding bit lines BL and connected to local I/O line pairs LIOT/B. Local IO line pairs LIOT/B are connected to main IO line pairs MIOT/B via transfer gates TG 19 which function as switches.

Turning to the explanation of a plurality of external terminals included in the semiconductor device 10, the plurality of external terminals includes address terminals 21, command terminals 22, clock terminals 23, data terminals 24 and power supply terminals 25 and 26. The data terminals 24 may be coupled to output butlers for read operations of memories. Alternatively, the data terminals 24 may be coupled to input buffers for read/write access of the memories that will be later described. FIG. 3 shows an example of dynamic random access memory (DRAM), however, any device having external terminals for signal input/output may be included as the external terminals of embodiments of the present disclosure.

The address terminals 21 are supplied with an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12, and a decoded column address signal YADD to the column decoder 13. The address decoder 32 also receives the bank address signal BADD and supplies the bank address signal BADD to the row decoder 12 and the column decoder 13.

The command terminals 22 are supplied with a command signal COM. The command signal COM may include one or more separate signals. The command signal COM input to the command terminals 21 is input to a command decoder 34 via the command input circuit 33. The command decoder 34 decodes the command signal COM to generate various internal command signals. For example, the internal commands may include a row command signal to select a word line and a column command signal, such as a read command or a write command, to select a bit line.

Accordingly, when a read command is issued and a row address and a column address are timely supplied with the read command, read data is read from a memory cell MC in the memory cell array 11 designated by these row address and column address. The read data DQ is output externally from the data terminals 24 via a read/write amplifier 15 and an input/output (IO) circuit 17. Similarly, when the write command is issued and a row address and a column address are timely supplied with the write command, and then write data DQ is supplied to the data terminals 24, the write data DQ is supplied via the input/output circuit 17 and the read/write amplifier 15 to the memory cell array 11 and written in the memory cell MC designated by the row address and the column address. The input/output circuit 17 may include input buffers, according to one embodiment. The clock terminals 23 are supplied with external clock signals CLK and CLKB, respectively. These external clock signals CLK and CLKB are complementary to each other and are supplied to the input/output circuit 17. The input/output circuit 17 receives the external clock signals CLK and CLKB that are used as a timing signal for determining input timing of write data DQ and output timing of read data DQ.

The power supply terminals 25 are supplied with power supply potentials VDD and VSS. These power supply potentials VDD and VSS are supplied to a voltage generator 39. The voltage generator 39 may generate various internal potentials VPP, VOD, VARY, VPERI, and the like based on the power supply potentials VDD and VSS. The internal potential VPP may be mainly used in the row decoder 12, the internal potentials VOD and VARY may be mainly used in the sense amplifiers 18 included in the memory cell array 11, and the internal potential VPERI may be used in many other circuit blocks.

Power supply potentials VDDQ and VSSQ are supplied to the input/output circuit 17. The power supply potentials VDDQ and VSSQ may be the same potentials as the power supply potentials VDD and VSS that are supplied to the power supply terminals 25, respectively. However, the dedicated power supply potentials VDDQ and VSSQ may be used for the input/output circuit 17 so that power supply noise generated by the input/output circuit 17 does not propagate to the other circuit blocks.

Figure 4:
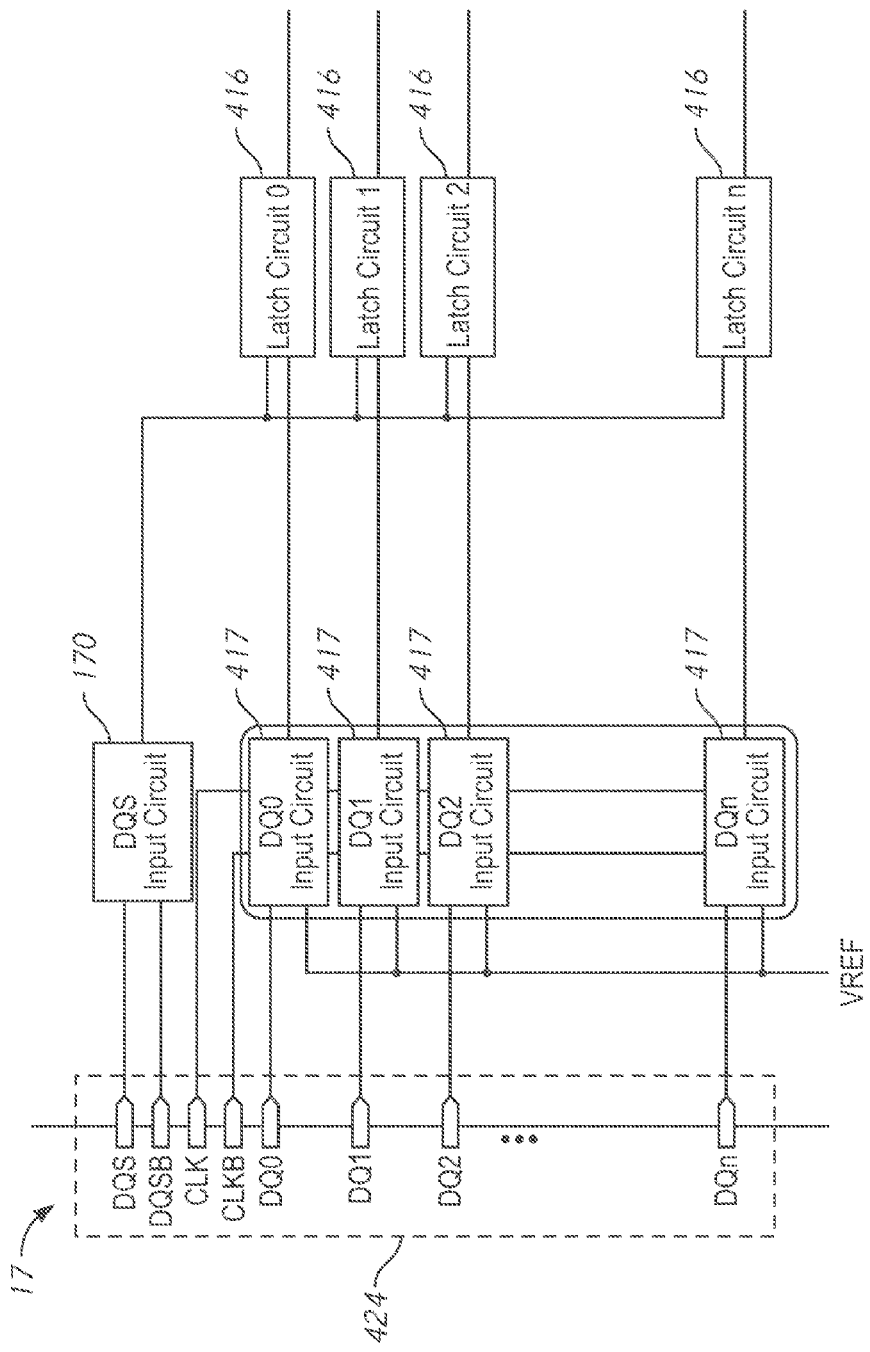
FIG. 4 is a schematic diagram of an input/output circuit including data input circuits in accordance with an embodiment of the present disclosure.

FIG. 4 is a schematic diagram of an input/output circuit 17 including data input circuits according to an embodiment of the present disclosure. The input/output circuit 17 includes data terminals 424 including a data strobe terminal DQS, a complementary data strobe terminal DQS13 and a plurality of data terminals DQ0-DQn where "n+1" is the number of the plurality of data terminals. A data strobe signal is used for capturing data at high data rates. The input/output circuit 17 also includes a data strobe (DQS) input circuit 170, a plurality of data input circuits 417 and a plurality of latch circuits 416 respective to the plurality of data terminals. The plurality of data input circuits 417 may be any data input circuit included in an input/output circuit 17 as will be described in FIGS. 5-7. The plurality of data input circuits 417 receive a reference voltage (VREF) and respective data the respective data terminals 424, and provide output signals. Each latch circuit 416 receives a data strobe signal from the DQS input circuit 170 and the respective output signal from the respective data input circuit for capturing the data.

Figure 5:
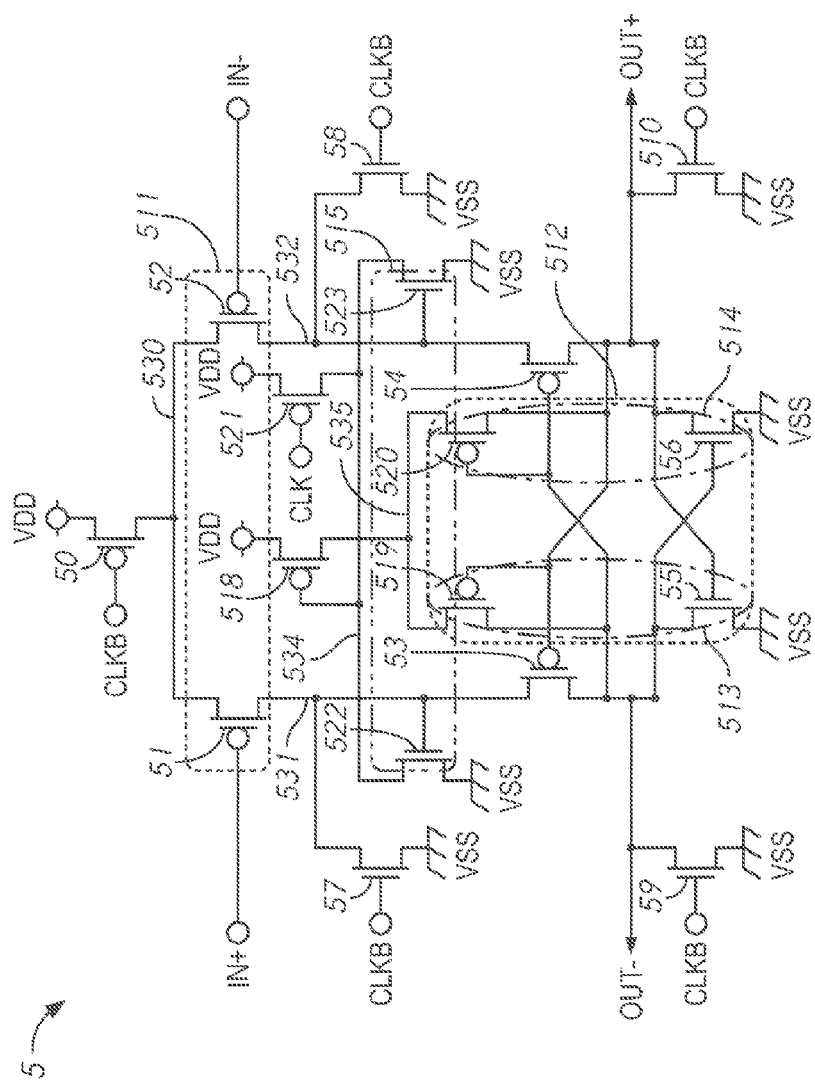
FIG. 5 is a circuit diagram of an input buffer circuit according to an embodiment of the present disclosure.

FIG. 5 is a circuit diagram of an apparatus including an input buffer circuit 5 according to an embodiment of the present disclosure. The input buffer circuit 5 may be included in the input/output circuit 17 of FIGS. 3 and 4 in some embodiments. The input buffer circuit 5 may include an input node IN+ that may receive a data input signal DQ, such as one of the write data that is supplied to the data terminals 24 in FIG. 3, and a reference node IN− supplied with a reference voltage (VREF), The input buffer circuit 5 may include amplifiers 511 and 512, The amplifier 511 may include transistors 51 and 52. The transistor 51 may be coupled between a node 530 and a node 531. The transistor 51 includes a gate coupled to the input node IN+. The transistor 52 may be coupled between the node 530 and a node 532. The transistor 52 includes a gate coupled to the reference node IN−. The node 530 may be a power supply node that is supplied with a power supply potential VDD from one of the power supply terminals 25 in FIG. 3 to the transistors 51 and 52, responsive to an inverted clock signal CLKB received at a gate of a transistor 50 that may function as a voltage switch for the amplifier 511. The amplifier 511 may provide intermediate voltages on the nodes 531 and 532 responsive to a voltage of the data input signal DQ and the reference voltage VREF via the transistors 51 and 52, respectively.

The input buffer circuit 5 may include a transistor 518 between a power supply node that is supplied with the power supply potential VDD from the one of the power supply terminals 25 in FIG. 3 and a node 535 (e.g., a circuit node). The input buffer circuit 5 may include a control circuit 515 that may include transistors 522 and 523 between the amplifiers 511 and 512. The transistors 522 and 523 includes gates that receive intermediate voltages on the nodes 531 and 532, respectively. For each of the transistors 522 and 523, one of a source or a drain may be coupled to a node 534 that is coupled to a gate of the transistor 518. Thus, the gate of the transistor 518 may be turned on by a voltage at the node 534 that may be responsive to at least the one of intermediate voltages on the nodes 531 and 532 via the transistors 522 and 523. The input buffer circuit 5 may include a transistor 53 that may include one of source and drain supplied with one of the intermediate voltages on the node 531 and the other of source and drain coupled to an output node OUT−. A gate of the transistor 53 may be coupled to an output node OUT+. The input buffer circuit 5 may include a transistor 54 that may include one of source and drain supplied with the other of the intermediate voltages on the node 532 and the other of source and drain coupled to the output node OUT+. A gate of the transistor 54 may be coupled to the output node OUT−.

The amplifier 512 may include inverters 513 and 514. The transistor 518 may function as a voltage switch for the amplifier 512. For example, the inverter 513 may be coupled between the node 535 and a power supply potential VSS from the other of the power supply terminals 25 in FIG. 3, and may include different types of transistors 55 and 519. The inverter 514 may be coupled between the node 535 and a power supply potential VSS from the other of the power supply terminals 25 in FIG. 3, and may include different types of transistors 56 and 520. For example, types of the transistors 55 and 56 may be the same and types of the transistors 519 and 520 may be the same. For example, the transistor 519 may be coupled between the node 535 and the output node OUT−. The transistor 519 may include a gate coupled to the output node OUT+. The transistor 520 may be coupled between the node 535 and the output node OUT+. The transistor 520 may include a gate coupled to the output node OUT−. The node 535 may be a power supply node that is supplied with the power supply potential VDD from the one of the power supply terminals 25 in FIG. 3 to the transistors 519 and 520, via the transistor 518 responsive to the voltage of the node 534 as earlier described. In other words, the output node OUT− may be coupled to an input node of the inverter 514 corresponding to the gates of the transistors 520 and 56, and an output node of the inverter 513 corresponding to either sources or drains of the transistors 519 and 55. Similarly, the output node OUT+ may be coupled to an input node of the inverter 513 corresponding to the gates of the transistors 519 and 55 and an output node of the inverter 514 corresponding to either sources or drains of the transistors 520 and 56.

A sequence of amplification and latch operation may be executed, when an inverted clock signal CLKB is at a logic low level that activates the transistor 50 and deactivates transistors 57, 58, 59 and 510. The power supply voltage VDD is provided to nodes, 531 and 532 through the transistors 51 and 52, and voltages of the nodes 531 and 532 are increased from a precharge level VSS responsive to the inverted clock signal CLKB is at the logic low level, depending on the data input signal DQ. Thus, a voltage difference Vdiff between the nodes 531 and 532 may be caused based on a difference between a voltage of the input data input signal DQ and the reference voltage VREF. Because the power supply voltage VDD may be provided to the nodes 531 and 532, voltages of the output nodes OUT− and OUT+ may be increased from the precharge level VSS through transistors 53 and 54 respectively, when the voltages of the nodes 531 and 532 exceed the threshold voltage VTh of the transistor 53 and a threshold voltage VTh of the transistor 54 respectively. Either the transistor 522 or the transistor 523 may be turned on to change a voltage of the node 534 from VDD to VSS and may activate the amplifier 512 by turning on the transistor 518 upon detecting either the voltage of the node 531 or the voltage of the node 532 exceeding the threshold voltage VTh of the transistors 53 or 54. Because the transistors 519 and 520 may receive the power supply voltage VDD via the transistor 518, driving currents of the transistors 519 and 520 of the amplifier 512 may be unaffected by the voltages of the data input signal DQ and the reference voltage VREF. Thus, the amplifier 512 may complete the sequence of amplification and latch operation and may provide the voltages of the output nodes OUT− and OUT+ by configuring the driving currents to be large, without waiting for the voltages of the nodes 531 and 532 to reach to approximately the power supply voltage VDD. In a precharge operation, the node 534 may be precharged to the power supply voltage VDD by a transistor 521.

Figure 6:
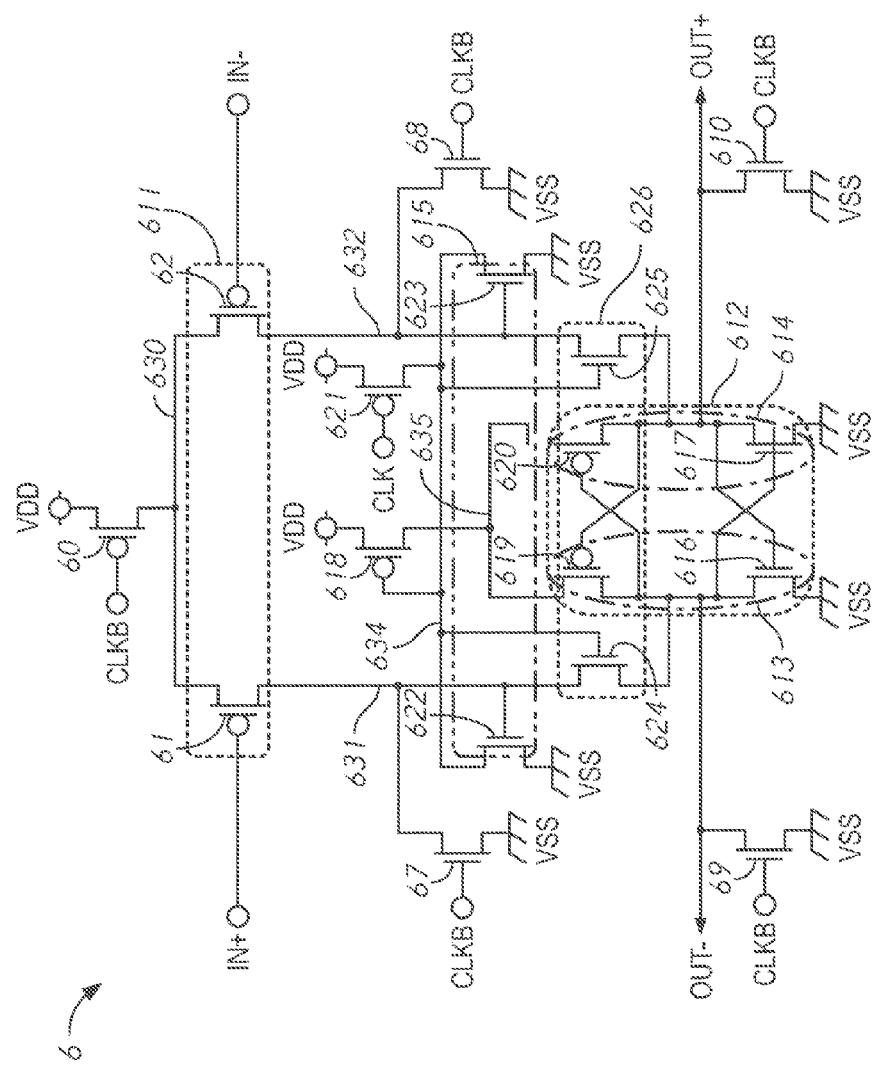
FIG. 6 is a circuit diagram of an input buffer circuit according to an embodiment of the present disclosure.

FIG. 6 is a circuit diagram of an input buffer circuit 6 according to an embodiment of the present disclosure. The input buffer circuit 6 may be included in the input/output circuit 17 of FIGS. 3 and 4 in some embodiments. The input buffer circuit 6 may include an input node IN+ that may receive a data input signal DQ, such as one of the write data that is supplied to the data terminals 24 in FIG. 3, and a reference node IN− supplied with a reference voltage (VREF). The input buffer circuit 6 may include amplifiers 611 and 612. The amplifier 611 may include transistors 61 and 62. The transistor 61 may be coupled between a node 630 and a node 631. The transistor 61 includes a gate coupled to the input node IN+. The transistor 62 may be coupled between the node 630 and a node 632. The transistor 62 includes a gate coupled to the reference node IN−. The node 630 may be a power supply node that is supplied with a power supply potential VDD from one of the power supply terminals 25 in FIG. 3 to the transistors 61 and 62, responsive to an inverted clock signal CLKB received at a gate of a transistor 60 that may function as a voltage switch for the amplifier 611. The amplifier 611 may provide intermediate voltages on the nodes 631 and 632 responsive to a voltage of the data input signal DQ and the reference voltage VREF via the transistors 61 and 62, respectively.

The input buffer circuit 6 may include a transistor 618 between a power supply node that is supplied with the power supply potential VDD from the one of the power supply terminals 25 in FIG. 3 and a node 635 (e.g., a circuit node). The input buffer circuit 6 may include a control circuit 615 that may include transistors 622 and 623 between the amplifiers 611 and 612. The transistors 622 and 623 includes gates that receive intermediate voltages on the nodes 631 and 632, respectively. For each of the transistors 622 and 623, one of a source or a drain may be coupled to a node 634 that is coupled to a gate of the transistor 618. Thus, the gate of the transistor 618 may be activated by a voltage of the node 634 that may be responsive to at least the one of intermediate voltages on the nodes 631 and 632 via the transistors 622 and 623.

The amplifier 612 may include inverters 613 and 614. The transistor 618 may function as a voltage switch for the amplifier 612. For example, the inverter 613 may be coupled between the node 635 and a power supply potential VSS from the other of the power supply terminals 25 in FIG. 3, and may include different types of transistors 616 and 619. The inverter 614 may be coupled between the node 635 and a power supply potential VSS from the other of the power supply terminals 25 in FIG. 3, and may include different types of transistors 617 and 620. For example, types of the transistors 616 and 617 may be the same and types of the transistors 619 and 620 may be the same. For example, the transistor 619 may be coupled between the node 635 and an output node OUT−. The transistor 619 may include a gate coupled to an output node OUT+. The transistor 620 may be coupled between the node 635 and the output node OUT+. The transistor 620 may include a gate coupled to the output node OUT−. The node 635 may be a power supply node that is supplied with the power supply potential VDD from the one of the power supply terminals 25 in FIG. 3 to the transistors 619 and 620, via the transistor 618 responsive to the voltage of the node 634 as earlier described. In other words, the output node OUT− may be coupled to an input node of the inverter 614 corresponding to the gates of the transistors 620 and 617, and an output node of the inverter 613 corresponding to sources or drains of the transistors 619 and 616. Similarly, the output node OUT+ may be coupled to an output node of the inverter 614 corresponding to the gates of the transistors 619 and 616 and an input node of the inverter 613 corresponding to either sources or drains of the transistors 620 and 617.

The input buffer circuit 6 may include a switch 626 between the amplifiers 611 and 612. For example, the switch may include transistors 624 and 625. The transistor 624 may be coupled between the node 631 and the output node OUT−. The transistor 625 may be coupled between the node 632 and the output node OUT+. Gates of the transistors 624 and 625 of the switch 626 may be coupled to one of a source or a drain of each of the transistors 622 and 623 in the control circuit 615, respectively. Thus, the switch 626 may couple the node 631 to the output node OUT− and may couple the node 632 to the output node OUT+, responsive to the voltage on the node 634, A sequence of amplification and latch operation may be executed, when an inverted clock signal CLKB is at a logic low level that activates the transistor 60 and deactivates transistors 67, 68, 69 and 610. The power supply voltage VDD is provided to nodes, 631 and 632 through the transistors 61 and 62, and voltages of the nodes 631 and 632 are increased from a precharge level VSS responsive to the inverted clock signal CLKB is at the logic low level, depending on the data input signal DQ. Thus, a voltage difference Vdiff between the nodes 631 and 632 may be caused based on a difference between a voltage of the input data input signal DQ and the reference voltage VREF, when the voltages of the node 631 or the node 632 coupled to gates of the transistor 622 or the transistor 623 exceeds the threshold voltage VTh of the transistor 622 or the threshold voltage VTh of the transistor 623, respectively. Thus, the transistors 622 and 623 in the control circuit 615 may be activated, respectively. A voltage of the node 634 may decrease from the power supply voltage VDD to the power supply voltage VSS, responsive to either the activate transistor 622 or the activated transistor 623. As a result, the decrease of the voltage of the node 634 may activate the transistor 618 and may deactivate the transistors 624 and 625. For example, the transistors 624 and 625 may be deactivated when a higher one of the voltages of the output nodes OUT− and OUT+ becomes a threshold voltage Vt, and the voltage difference Vdiff between the nodes 631 and 632 may be suitable for the amplifying operation. The output nodes OUT− and OUT+ may hold the voltages of the nodes 631 and 632 until the transistors 624 and 625 are deactivated. The voltage difference Vdiff between the nodes 631 and 632 may be maintained until the deactivation of the transistors 624 and 625 and may be amplified and latched by the amplifier 612 responsive to the deactivation of the transistors 624 and 625 due to the decrease of the voltage of the node 634. Thus, the amplifier 612 may start the sequence of amplification and latch operation regardless of the voltage of data input signal DQ and the reference voltage VREF.

Figure 7:
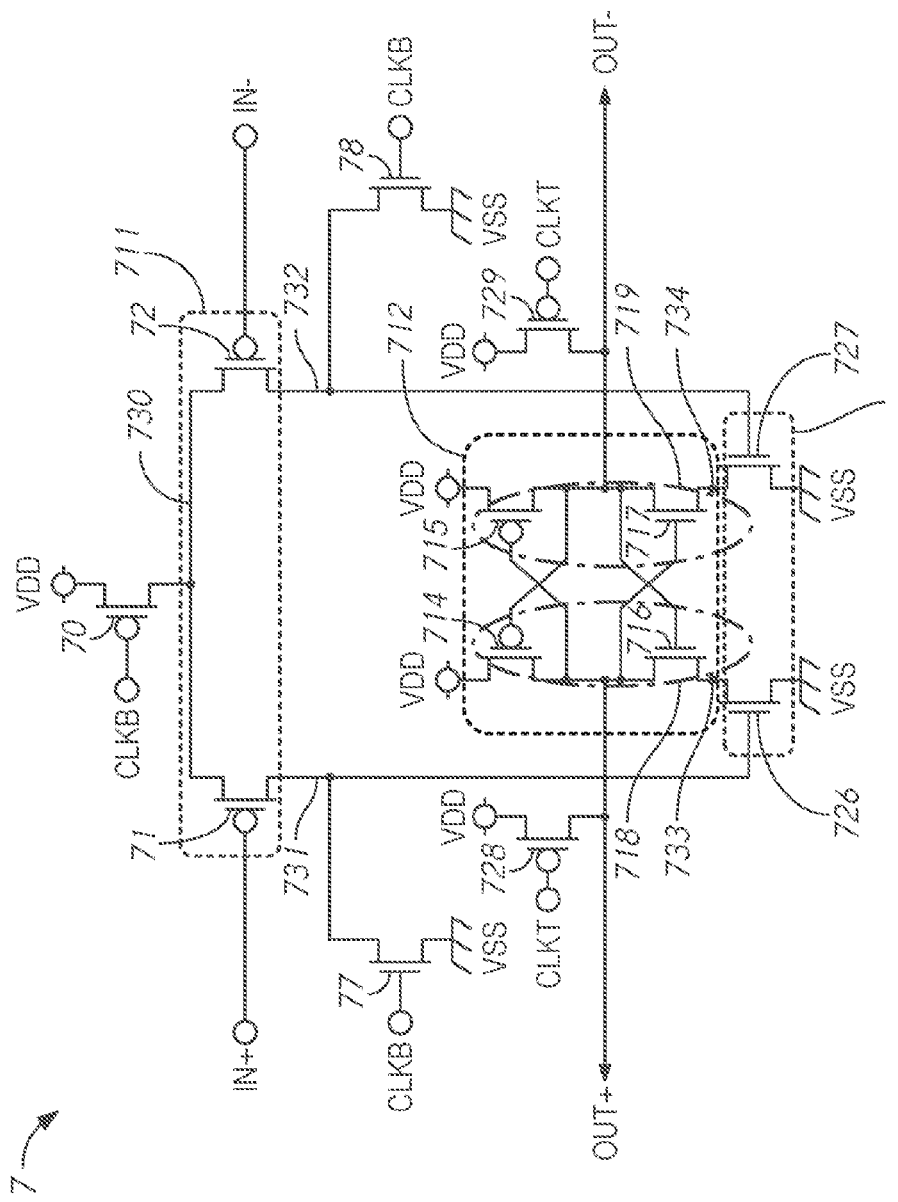
FIG. 7 is a circuit diagram of an input buffer circuit according to an embodiment of the present disclosure.

FIG. 7 is a circuit diagram of an input buffer circuit 7 according to an embodiment of the present disclosure. The input buffer circuit 7 may be included in the input/output circuit 17 of FIGS. 3 and 4 in some embodiments. The input buffer circuit 7 may include an input node IN+ that may receive a data input signal DQ, such as one of the write data that is supplied to the data terminals 24 in FIG. 3, and a reference node IN− supplied with a reference voltage (VREF). The input buffer circuit 7 may include amplifiers 711 and 712. The amplifier 711 may include transistors 71 and 72. The transistor 71 may be coupled between a node 730 and a node 731. The transistor 71 includes a gate coupled to the input node IN+. The transistor 72 may be coupled between the node 730 and a node 732. The nodes 731 and 732 may be isolated from each other, via transistors 716 and 717. The transistor 72 includes a gate coupled to the reference node IN−. The node 730 may be a power supply node that is supplied with a power supply potential VDD from one of the power supply terminals 25 in FIG. 3 to the transistors 71 and 72, responsive to an inverted clock signal CLKB received at a gate of a transistor 70 that may function as a voltage switch for the amplifier 711. The amplifier 711 may provide intermediate voltages on the nodes 731 and 732 responsive to a first input voltage of the data input signal DQ and a second input voltage (e.g., the reference voltage VREF) via the transistors 71 and 72, respectively.

The amplifier 712 may include inverters 718 and 719. The inverter 718 may include a transistor 714 and the transistor 716. The inverter 719 may include a transistor 715 and the transistor 717. For example, the inverter 718 may be coupled between a node 733 (e.g., a circuit node) and the power supply potential VDD from the one of the power supply terminals 25 in FIG. 3, and may include different types of transistors 714 and 716. The inverter 719 may be coupled between a node 734 (e.g., a circuit node) and the power supply potential VDD from the one of the power supply terminals 25 in FIG. 3, and may include different types of transistors 715 and 717. For example, types of the transistors 714 and 715 may be the same and types of the transistors 716 and 717 may be the same. For example, the transistor 716 may be coupled between the node 733 and an output node OUT+. The transistor 716 may include a gate coupled to an output node OUT−. For example, the transistor 717 may be coupled between the node 734 and the output node OUT−. The transistor 717 may include a gate coupled to the output node OUT+.

A voltage switch 720 may include transistors 726 and 727. The transistors 726 and 727 have gates that may receive the intermediate voltages on the node 731 and 732, respectively. Thus, the transistors 726 and 727 may be activated (e.g., turned on) responsive to the intermediate voltages on the node 731 and 732, respectively. The nodes 733 and 734 may be power supply nodes that are supplied with a power supply potential VSS from the other of the power supply terminals 25 in FIG. 3 to the transistors 716 and 717, via the transistors 726 and 727 responsive to the intermediate voltages of the nodes 731 and 732 as earlier described. In other words, the output node OUT− may be coupled to an input node of the inverter 718 corresponding to the gates of the transistors 714 and 716, and an output node of the inverter 719 corresponding to either sources or drains of the transistors 715 and 717. Similarly, the output node OUT+ may be coupled to an input node of the inverter 719 corresponding to the gates of the transistors 715 and 717, and an output node of the inverter 718 corresponding to either sources or drains of the transistors 714 and 716.

A sequence of amplification and latch operation may be executed, when an inverted clock signal CLKB is set to a logic low level that activates the transistor 70, transistors 77 and 78 coupled between the power supply voltage VSS and the nodes 731 and respectively. Simultaneously, a clock signal CLKT is set to a logic high level that deactivates transistors 728 and 729, coupled between the power supply voltage VDD and the output nodes OUT+ and OUT−, respectively. The power supply voltage VDD is provided to nodes, 731 and 732 through the transistors 71 and 72, and voltages of the nodes 731 and 732 are increased from a precharge level VSS responsive to the inverted clock signal CLKB is at the logic low level, depending on the data input signal DQ. Thus, a voltage difference Vdiff between the nodes 731 and 732 may be caused based on a difference between a voltage of the input data input signal DQ and the reference voltage VREF, when the voltages of the nodes 731 and 732 exceed the threshold voltage VTh of the transistor 726 or the threshold voltage VTh of the transistor 727. Because the transistors 71 and 72 may activate the transistors 726 and 727 by driving gate capacitors of the transistors 726 and 727 respectively, the intermediate voltages of the nodes 731 and 732 may increase quickly after the inversed clock signal CLKB is set to the logic low level. Thus the amplifier 712 may complete the sequence of amplification and latch operation by the activation of the transistors 726 and 727, when the voltage of the node 731 or the voltage of the node 732 exceeds the threshold voltage VTh of the transistor 726 or the threshold voltage VTh of the transistor 727, respectively. Thus, the amplifier 712 may start the sequence of amplification and latch operation regardless of the voltage of data input signal DQ and the reference voltage VREF. In the precharge operation, the output nodes OUT− and OUT+ may be precharged to the power supply voltage VDD by the transistors 728 and 729.

Logic levels of signals used in the embodiments described the above are merely examples. However, in other embodiments, combinations of the logic levels of signals other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:
1. An apparatus comprising:
 a first amplifier configured to provide first and second intermediate voltages responsive to first and second input voltages;
 first and second voltage terminals;
 a circuit node;
 an additional circuit node, wherein the circuit node and the additional circuit node are isolated from each other;
 a first transistor coupled between the first voltage terminal and the circuit node and configured to be turned on responsive to at least one of the first and second intermediate voltages;
 a second transistor coupled between the first voltage terminal and the additional circuit node;
 a second amplifier comprising first and second inverters, the first inverter coupled between the circuit node and the second voltage terminal, wherein the first transistor is configured to be turned on responsive to the first intermediate voltage and the second transistor is configured to be turned on responsive to the second intermediate voltage; and first and second output nodes, the first output node being coupled to an input node of the first inverter and an output node of the second inverter, and the second output node being coupled to an output node of the first inverter and an input node of the second inverter.

2. The apparatus of claim 1, wherein the second amplifier is configured to be activated responsive to either the first intermediate voltage exceeding a threshold voltage of the first transistor or the second intermediate voltage exceeding a threshold voltage of the second transistor.

3. The apparatus of claim 1, further comprising a control circuit including a second transistor having a gate supplied with one of the first and second intermediate voltages and one of a source and a drain coupled to a gate of the first transistor.

4. The apparatus of claim 1, further comprising a control circuit including:
 a second transistor having a gate supplied with the first intermediate voltage and one of a source and a drain coupled to a gate of the first transistor; and
 a third transistor having a gate supplied with the second intermediate voltage and one of a source and a drain coupled to the gate of the first transistor.

5. The apparatus of claim 4, further comprising:
 a fourth transistor having one of a source and a drain supplied with the first intermediate voltage and an other of the source and the drain coupled to the first output node; and
 a fifth transistor having one of a source and a drain supplied with the second intermediate voltage and an other of the source and the drain coupled to the second output node.

6. The apparatus of claim 5, wherein the fourth transistor has a gate coupled to the second output node and the fifth transistor has a gate coupled to the first output node.

7. The apparatus of claim 5, wherein the fourth transistor has a gate coupled to the one of the source and the drain of the second transistor and the fifth transistor has a gate coupled to the one of the source and the drain of the third transistor.

8. The apparatus of claim 7, wherein the fourth and fifth transistors are configured to be deactivated when a voltage of the first output node or the second output node exceeds a threshold voltage of the fourth transistor and the fifth transistor.

9. An apparatus comprising:
 a first amplifier configured to provide first and second intermediate voltages responsive to first and second input voltages;
 first and second voltage terminals;
 a circuit node;
 a first transistor coupled between the first voltage terminal and the circuit node and configured to be turned on responsive to at least one of the first and second intermediate voltages;
 a second amplifier comprising first and second inverters, at least one of the first and second inverters being coupled between the circuit node and the second voltage terminal;
 first and second output nodes, the first output node being coupled to an input node of the first inverter and an output node of the second inverter, and the second output node being coupled to an output node of the first inverter and an input node of the second inverter; and
 a control circuit including a second transistor having a gate supplied with one of the first and second intermediate voltages and one of a source and a drain coupled to a gate of the first transistor.

10. An apparatus comprising:
 a first amplifier configured to provide first and second intermediate voltages responsive to first and second input voltages;
 first and second voltage terminals;
 a circuit node;
 a first transistor coupled between the first voltage terminal and the circuit node and configured to be turned on responsive to at least one of the first and second intermediate voltages;
 a second amplifier comprising first and second inverters, at least one of the first and second inverters being coupled between the circuit node and the second voltage terminal;
 first and second output nodes, the first output node being coupled to an input node of the first inverter and an output node of the second inverter, and the second output node being coupled to an output node of the first inverter and an input node of the second inverter; and
 a control circuit including:
  a second transistor having a gate supplied with the first intermediate voltage and one of a source and a drain coupled to a gate of the first transistor; and
  a third transistor having a gate supplied with the second intermediate voltage and one of a source and a drain coupled to the gate of the first transistor.

11. The apparatus of claim 10, further comprising:
 a fourth transistor having one of a source and a drain supplied with the first intermediate voltage and an other of the source and the drain coupled to the first output node; and
 a fifth transistor having one of a source and a drain supplied with the second intermediate voltage and an other of the source and the drain coupled to the second output node.

12. The apparatus of claim 11, wherein the fourth transistor has a gate coupled to the second output node and the fifth transistor has a gate coupled to the first output node.

13. The apparatus of claim 11, wherein the fourth transistor has a gate coupled to the one of the source and the drain of the second transistor and the fifth transistor has a gate coupled to the one of the source and the drain of the third transistor.

14. The apparatus of claim 13, wherein the fourth and fifth transistors are configured to be deactivated when a voltage of the first output node or the second output node exceeds a threshold voltage of the fourth transistor and the fifth transistor.

* * * * *